US009735277B2

(12) United States Patent
Cheng et al.

(10) Patent No.: US 9,735,277 B2
(45) Date of Patent: Aug. 15, 2017

(54) PARTIALLY DIELECTRIC ISOLATED FIN-SHAPED FIELD EFFECT TRANSISTOR (FINFET)

(71) Applicant: International Business Machines Corporation, Armonk, NY (US)

(72) Inventors: Kangguo Cheng, Schenectady, NY (US); Ramachandra Divakaruni, Ossining, NY (US); Johnathan E. Faltermeier, San Jose, CA (US); Edward J. Nowak, Essex Junction, VT (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/336,654

(22) Filed: Oct. 27, 2016

(65) Prior Publication Data

US 2017/0170323 A1 Jun. 15, 2017

Related U.S. Application Data

(63) Continuation of application No. 14/968,816, filed on Dec. 14, 2015, now Pat. No. 9,537,011.

(51) Int. Cl.
*H01L 29/78* (2006.01)
*H01L 29/06* (2006.01)
(Continued)

(52) U.S. Cl.
CPC .... *H01L 29/7856* (2013.01); *H01L 21/30604* (2013.01); *H01L 21/7624* (2013.01);
(Continued)

(58) Field of Classification Search
None
See application file for complete search history.

(56) References Cited

U.S. PATENT DOCUMENTS 6,432,754 B1    8/2002    Assaderaghi et al.
7,224,033 B2    5/2007    Zhu et al.
(Continued)

FOREIGN PATENT DOCUMENTS

CN    104167361 A    11/2014

OTHER PUBLICATIONS

Numata, T. et al., "Source/drain and Gate Engineering on Si Nanowire transistors with Reduced Parasitic Resistance and Strained Silicon Channel", Proceedings of 10th IEEE International Conference on Solid-State and Integrated Circuit Technology, (ICSICT), Nov. 1-4, 2010, pp. 37-40, IEEE, United States.
(Continued)

*Primary Examiner* — Joseph Schoenholtz
(74) *Attorney, Agent, or Firm* — Sherman IP LLP; Kenneth L. Sherman; Hemavathy Perumal

(57) ABSTRACT

One embodiment provides a method comprising etching a fin of a fin-shaped field effect transistor (FinFET) to form a reduced fin, and laterally etching the reduced fin to form a fin channel including a first fin channel sidewall and a second fin channel sidewall opposing the first fin channel sidewall. The method further comprises forming a first thin dielectric tunnel and a second thin dielectric tunnel on the first fin channel sidewall and the second fin channel sidewall, respectively. Each thin dielectric tunnel prevents lateral epitaxial crystal growth on the fin channel. The method further comprises etching an insulator layer disposed between the fin channel and a substrate of the FinFET to expose portions of a substrate surface of the substrate. A source epitaxy and a drain epitaxy are formed from vertical
(Continued)

epitaxial crystal growth on the exposed portions of the substrate surface after epitaxial deposition.

6 Claims, 5 Drawing Sheets

(51) Int. Cl.
  *H01L 21/762* (2006.01)
  *H01L 29/66* (2006.01)
  *H01L 21/306* (2006.01)

(52) U.S. Cl.
  CPC .... *H01L 29/0649* (2013.01); *H01L 29/66795* (2013.01); *H01L 2029/7857* (2013.01)

(56) References Cited

U.S. PATENT DOCUMENTS

| | | | |
|---|---|---|---|
| 7,314,802 B2 | 1/2008 | Zhu et al. | |
| 7,402,856 B2 | 7/2008 | Brask et al. | |
| 7,696,032 B2 | 4/2010 | Kim | |
| 7,960,801 B2 | 6/2011 | Chidambarrao | |
| 7,994,020 B2 | 8/2011 | Lin et al. | |
| 8,101,486 B2 | 1/2012 | Maszara et al. | |
| 8,106,459 B2 | 1/2012 | Chang et al. | |
| 8,293,616 B2 | 10/2012 | Chang et al. | |
| 8,445,973 B2 | 5/2013 | Luo et al. | |
| 8,901,570 B2 | 12/2014 | Aigo et al. | |
| 8,937,005 B2 | 1/2015 | Scudder et al. | |
| 8,993,399 B2 | 3/2015 | Cheng et al. | |
| 9,041,062 B2 | 5/2015 | Cheng et al. | |
| 9,093,496 B2 | 7/2015 | Jacob et al. | |
| 9,117,875 B2 | 8/2015 | Jacob | |
| 2011/0068431 A1 | 3/2011 | Knorr et al. | |
| 2014/0061862 A1 | 3/2014 | Vega et al. | |
| 2014/0353755 A1* | 12/2014 | Nowak | H01L 29/66795 257/347 |
| 2015/0001591 A1 | 1/2015 | Akarvardar et al. | |
| 2015/0069327 A1 | 3/2015 | Cheng et al. | |
| 2015/0102393 A1 | 4/2015 | Mieno | |
| 2015/0162438 A1 | 6/2015 | Chou | |
| 2015/0228668 A1 | 8/2015 | Ponoth et al. | |
| 2016/0163811 A1* | 6/2016 | Anderson | H01L 29/7827 257/329 |
| 2016/0197187 A1 | 7/2016 | Cheng | |
| 2016/0315149 A1* | 10/2016 | Cheng | H01L 29/66795 |

OTHER PUBLICATIONS

Cheng, K. et al., "Bottom Oxidation through STI (BOTS)—A Novel Approach to Fabricate Dielectric Isolated FinFETs on Bulk Substrates", Proceedings of the 2014 Symposium on VLSI Technology (VLSI-Technology): Digest of Technical Papers, Jun. 9-12, 2014, pp. 1-2, IEEE, United States.
List of IBM Patents or Applications Treated as Related.

\* cited by examiner

PARTIALLY DIELECTRIC ISOLATED FIN-SHAPED FIELD EFFECT TRANSISTOR (FINFET)

The present invention generally relates to semiconductor fin-shaped field effect transistors (FinFETs), and more particularly, a semiconductor partial fin-on-oxide (FOX) FinFET and a method of forming the partial FOX FinFET.

BACKGROUND

A key challenge to forming a conventional partial FOX FinFET structure is that epitaxial crystal growth in source/drain involves vertical (i.e., bottom-up) epitaxial crystal growth from a silicon substrate and lateral epitaxial crystal growth from sidewalls of a silicon fin. The multi-dimensional source/drain epitaxy resulting from the vertical and lateral epitaxial crystal growths may include, thereby degrading device performance. Therefore, there is a need for forming a partial FOX FinFET having a dielectric only under a fin channel.

SUMMARY

One embodiment provides a method comprising etching a fin of a fin-shaped field effect transistor (FinFET) to form a reduced fin, and laterally etching the reduced fin to form a fin channel including a first fin channel sidewall and a second fin channel sidewall opposing the first fin channel sidewall. The method further comprises forming a first thin dielectric tunnel and a second thin dielectric tunnel on the first fin channel sidewall and the second fin channel sidewall, respectively. Each thin dielectric tunnel prevents lateral epitaxial crystal growth on the fin channel. The method further comprises etching an insulator layer disposed between the fin channel and a substrate of the FinFET to expose portions of a substrate surface of the substrate. A source epitaxy and a drain epitaxy are formed from vertical epitaxial crystal growth on the exposed portions of the substrate surface after epitaxial deposition.

Another embodiment provides a semiconductor structure comprising a substrate including a substrate surface, and a fin channel including a first fin channel sidewall and a second fin channel sidewall opposing the first fin channel sidewall. The semiconductor structure further comprises a first thin dielectric tunnel and a second thin dielectric tunnel disposed on the first fin channel sidewall and the second fin channel sidewall, respectively. Each thin dielectric tunnel prevents lateral epitaxial crystal growth on the fin channel. The semiconductor structure further comprises an insulator layer including a first insulator layer sidewall and a second insulator layer sidewall opposing the first insulator layer sidewall. The insulator layer is disposed between the substrate and the fin channel to insulate the substrate from the fin channel. The insulator layer is narrower than the substrate, thereby exposing portions of the substrate surface for vertical epitaxial crystal growth. The semiconductor structure further comprises a gate perpendicular to the fin channel. The fin channel is narrower than the gate. The semiconductor structure further comprises a spacer including a first spacer sidewall and a second spacer sidewall opposing the first spacer sidewall. The first spacer sidewall and the second spacer sidewall are substantially aligned with the first insulator layer sidewall and the second insulator layer sidewall, respectively. A dielectric layer disposed between the fin channel and the gate separate the fin channel from the gate. The semiconductor structure further comprises a source epitaxy resulting from vertical epitaxial crystal growth on at least one exposed portion of the substrate surface, and a drain epitaxy resulting from vertical epitaxial crystal growth on at least one other exposed portion of the substrate surface.

These and other aspects, features and advantages of the invention will be understood with reference to the drawing figures, and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present invention generally relates to fin-shaped field effect transistor (FinFET), and more particularly, a partial fin-on-oxide (FOX) FinFET and a method of forming the partial FOX FinFET. One embodiment provides a method comprising etching a fin of a fin-shaped field effect transistor (FinFET) to form a reduced fin, and laterally etching the reduced fin to form a fin channel including a first fin channel sidewall and a second fin channel sidewall opposing the first fin channel sidewall. The method further comprises forming a first thin dielectric tunnel and a second thin dielectric tunnel on the first fin channel sidewall and the second fin channel sidewall, respectively. Each thin dielectric tunnel prevents lateral epitaxial crystal growth on the fin channel. The method further comprises etching an insulator layer disposed between the fin channel and a substrate of the FinFET to expose portions of a substrate surface of the substrate. A source epitaxy and a drain epitaxy are formed from vertical epitaxial crystal growth on the exposed portions of the substrate surface after epitaxial deposition.

Another embodiment provides a semiconductor structure comprising a substrate including a substrate surface, and a fin channel including a first fin channel sidewall and a second fin channel sidewall opposing the first fin channel sidewall. The semiconductor structure further comprises a first thin dielectric tunnel and a second thin dielectric tunnel disposed on the first fin channel sidewall and the second fin channel sidewall, respectively. Each thin dielectric tunnel prevents lateral epitaxial crystal growth on the fin channel. The semiconductor structure further comprises an insulator layer including a first insulator layer sidewall and a second insulator layer sidewall opposing the first insulator layer sidewall. The insulator layer is disposed between the substrate and the fin channel to insulate the substrate from the fin channel. The insulator layer is narrower than the substrate, thereby exposing portions of the substrate surface for vertical epitaxial crystal growth. The semiconductor structure further comprises a gate perpendicular to the fin channel. The fin channel is narrower than the gate. The semiconductor structure further comprises a spacer including a first spacer sidewall and a second spacer sidewall opposing the first spacer sidewall. The first spacer sidewall and the second spacer sidewall are substantially aligned with the first insulator layer sidewall and the second insulator layer sidewall, respectively. A dielectric layer disposed between the fin channel and the gate separate the fin channel from the gate. The semiconductor structure further comprises a source epitaxy resulting from vertical epitaxial crystal growth on at least one exposed portion of the substrate surface, and a drain epitaxy resulting from vertical epitaxial crystal growth on at least one other exposed portion of the substrate surface.

Figure 1:
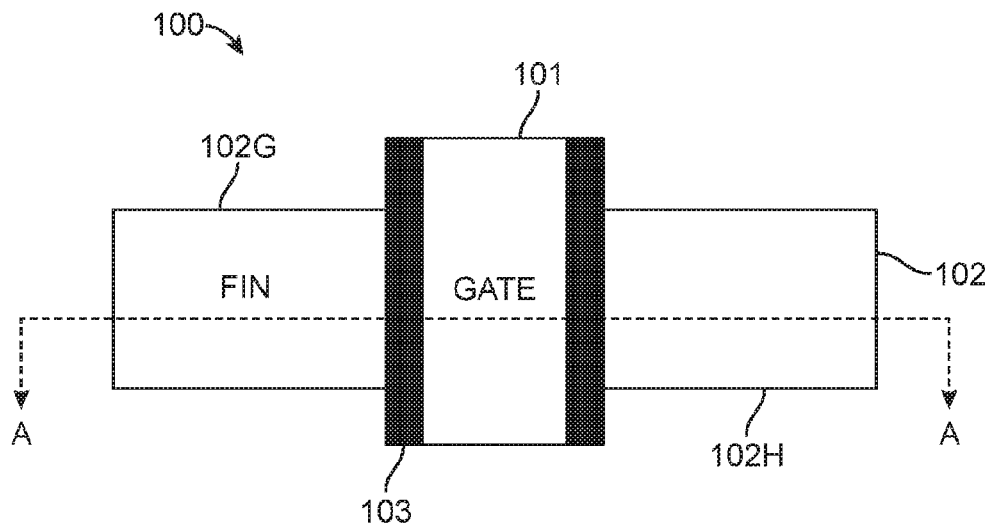
FIG. 1 illustrates a top-down view of a fin-shaped field effect transistor (FinFET) structure before epitaxial deposition.
Figure 2:
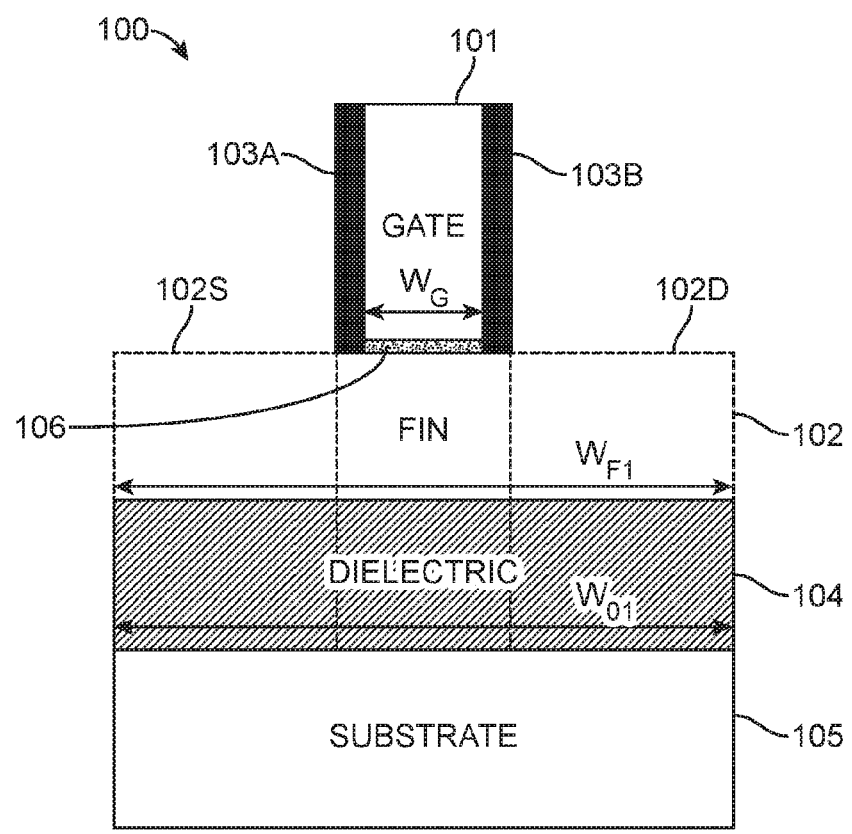
FIG. 2 illustrates a cross-sectional view of the FinFET structure along lines A-A of FIG. 1.

FIG. 1 illustrates a top-down view of a semiconductor FinFET structure 100 before epitaxial deposition. FIG. 2 illustrates a cross-sectional view of the FinFET structure 100 along lines A-A of FIG. 1. The FinFET structure 100 is fabricated on a silicon substrate 105. A silicon fin 102 extends horizontally on an insulator layer 104 that insulates the substrate 105 from the fin 102. The insulator layer 104 may comprise a dielectric material (e.g., oxide, nitride, oxynitride, high-k, etc.) or a combination of different dielectric materials. The insulator layer 104 may be formed in different ways, such as using a semiconductor-on-insulator (SOI), using a bulk substrate together with another technique (e.g., silicon-on-nothing), etc.

Let $W_{F1}$ denote a dimension (e.g., width or thickness) of the fin 102. Let $W_{O1}$ denote a dimension (e.g., width or thickness) of the insulator layer 104.

The FinFET structure 100 further comprises a gate 101 that is perpendicular to the fin 102. The gate 101 extends across the fin 102 and wraps around opposing sidewalls 102G and 102H of the fin 102. The gate 101 acts as a conductor. The fin 102 is isolated/separated from the gate 101 by a thin dielectric layer ("gate dielectric layer") 106. The gate dielectric layer 106 has a corresponding thickness in the range of 1 nanometer (nm) to 4 nm.

Let $W_G$ denote a dimension (e.g., width or thickness) of the gate 101.

The fin 102 overlaps a source region 102S and a drain region 102D. After epitaxial deposition (i.e., epitaxial crystal growth), the fin 102 acts as a channel, connecting epitaxy deposited in the source region 102S to epitaxy deposited in the drain region 102D.

The FinFET structure 100 further comprises a spacer 103 including a pair of opposing spacer sidewalls 103A and 103B.

Embodiments of the invention provide a semiconductor partial fin-on-oxide (FOX) FinFET structure 200 (FIG. 7) having a dielectric only under a fin channel. Embodiments of the invention further provide a method for forming the partial FOX FinFET structure 200.

Figure 3:
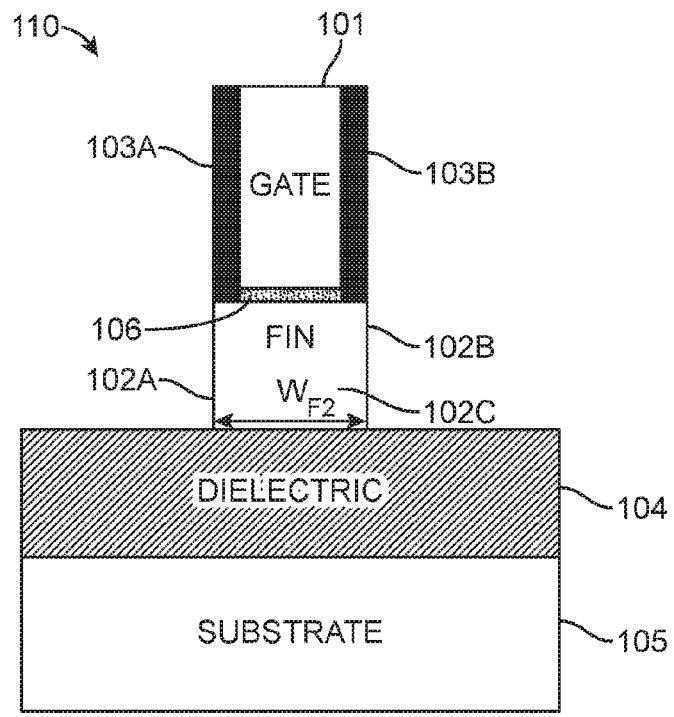
FIG. 3 illustrates a first stage process of forming a partial fin-on-oxide (FOX) FinFET structure, in accordance with an embodiment.

The following discussion illustrates a method of forming the partial FOX FinFET structure 200 using the FinFET structure 100. FIG. 3 illustrates a first stage process 110 of forming a partial FOX FinFET structure 200, in accordance with an embodiment. In the first stage process 110, an anisotropic etch process, such as reactive ion etching (RIE), is applied to etch the fin 102 of the FinFET structure 100. In one example implementation, a first portion and a second portion of the fin 102 that overlaps the source region 102S and the drain region 102D, respectively, are recessed/removed via RIE, resulting in the reduced fin 102C. The reduced fin 102C has a pair of opposing fin sidewalls 102A and 102B.

Let $W_{F2}$ denote a dimension (e.g., width or thickness) of the reduced fin 102C. The reduced fin 102C is narrower than the fin 102 (i.e., $W_{F1} > W_{F2}$). Further, the fin sidewalls 102A and 102B are aligned with the spacer sidewalls 103A and 103B, respectively.

Figure 4:
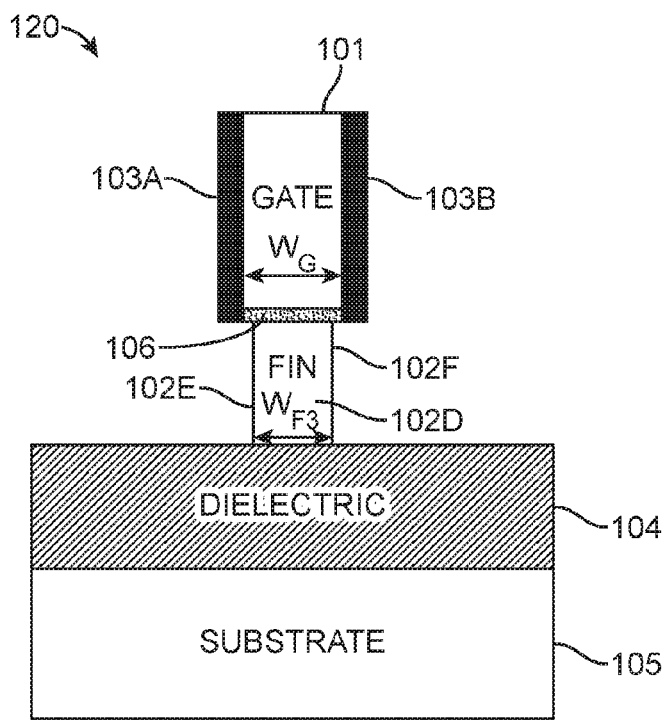
FIG. 4 illustrates a second stage process of forming the partial FOX FinFET structure, in accordance with an embodiment.

FIG. 4 illustrates a second stage process 120 of forming the partial FOX FinFET structure 200, in accordance with an embodiment. In the second stage process 120, lateral pullback/etching is applied to etch the reduced fin 102C. Specifically, the fin sidewalls 102A and 102B are trimmed to form a fin channel 102D. The fin channel 102D has a pair of opposing fin channel sidewalls 102E and 102F.

Let $W_{F3}$ denote a dimension (e.g., width or thickness) of the fin channel 102D. The fin channel 102D is narrower than the reduced fin 102C (i.e., $W_{F2} > W_{F3}$). The fin channel 102D is narrower than the gate 101 (i.e., $W_G > W_{F3}$).

Figure 5:
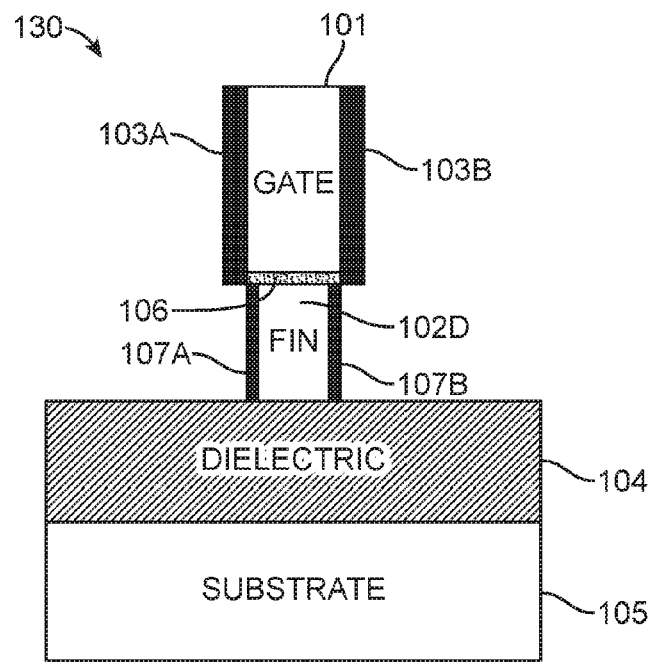
FIG. 5 illustrates a third stage process of forming the partial FOX FinFET structure, in accordance with an embodiment.

FIG. 5 illustrates a third stage process 130 of forming the partial FOX FinFET structure 200, in accordance with an embodiment. In the third stage process 130, a thin dielectric layer is applied to each opposing fin channel sidewall 102E, 102F of the fin channel 102D to form a pair of opposing thin dielectric tunnels 107A and 107B. The thin dielectric tunnels 107A and 107B may be formed, for example, by thermal nitridation or plasma nitridation (i.e., the thin dielectric tunnels 107A and 107B comprise nitride).

Each thin dielectric tunnel 107A, 107B must satisfy the following conditions: (1) each thin dielectric tunnel 107A, 107B must be thin enough to allow carriers (i.e., electrons and/or holes) to pass through, and (2) each thin dielectric tunnel 107A, 107B must be thick enough to withstand epitaxial pre-clean before epitaxial deposition. After epitaxial deposition, each thin dielectric tunnel 107A, 107B is thin enough to allow current to pass through the fin channel 102D from epitaxy deposited in the source region 102S to epitaxy deposited in the drain region 102D.

In one embodiment, each thin dielectric tunnel 107A, 107B has a corresponding thickness that is less than 1 nm. Self-limiting thermal nitridation may be used to form the thin dielectric tunnels 107A and 107B, where the nitridation temperature may range from 500° C. to 900° C. in an environment containing nitrogen or ammonia.

Figure 6:
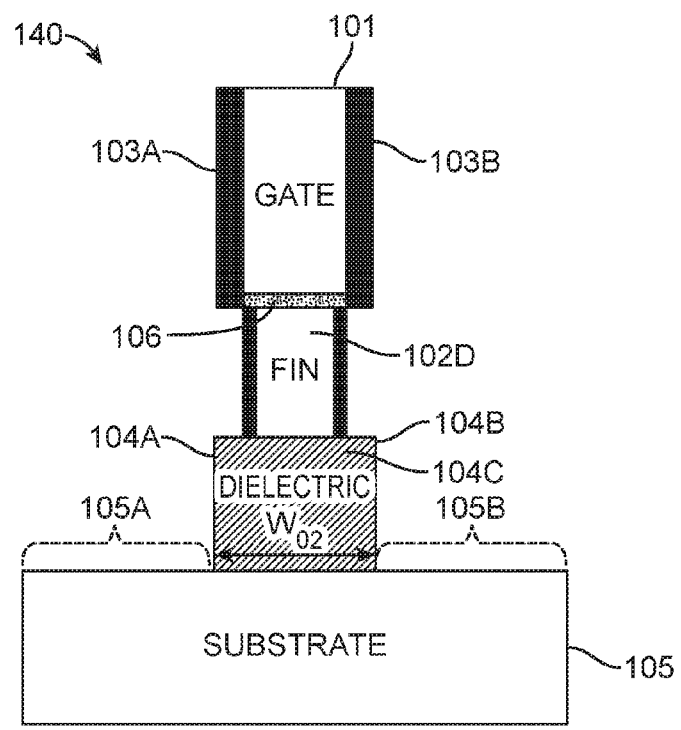
FIG. 6 illustrates a fourth stage process of forming the partial FOX FinFET structure, in accordance with an embodiment.

FIG. 6 illustrates a fourth stage process 140 of forming the partial FOX FinFET structure 200, in accordance with an embodiment. In the fourth stage process 140, an anisotropic etch process, such as RIE, is applied to etch the insulator layer 104. In one example implementation, a first portion and a second portion of the insulator layer 104 that overlaps the source region 102S and the drain region 102D, respectively, are recessed/removed via RIE, resulting in the reduced insulator layer 104C. The reduced insulator layer 104C has a pair of opposing insulator layer sidewalls 104A and 104B. The thin dielectric tunnels 107A and 107B on the fin channel 102D remain intact during the RIE process as the thin dielectric tunnels 107A and 107B are shallowed by the gate 101 and the spacer sidewalls 103A and 103B (the fin channel 102D is narrower than the gate 101).

Let $W_{O2}$ denote a dimension (e.g., width or thickness) of the reduced insulator layer 104C. The reduced insulator layer 104C is narrower than the insulator layer 104 (i.e., $W_{O1} > W_{O2}$). Further, the insulator layer sidewalls 104A and 104B are substantially aligned with the spacer sidewalls 103A and 103B, respectively.

Recessing/removing portions of the insulator layer 104 as described above exposes one or more portions of a surface of the substrate 105 (the reduced insulator layer 104C is narrower than the substrate 105). For example, as shown in FIG. 6, the substrate 105 has a first exposed surface 105A and a second exposed surface 105B.

The thin dielectric tunnels 107A, 107B prevent lateral epitaxial crystal growth during epitaxial deposition. As such, epitaxial crystal growth during epitaxial deposition is only limited to vertical (i.e., bottom-up) epitaxial crystal growth on the exposed surfaces 105A and 105B of the substrate 105.

In one embodiment, epitaxial preclean is performed before epitaxial deposition to prepare the exposed surfaces 105A and 105B of the substrate 105 for epitaxial crystal growth.

Figure 7:
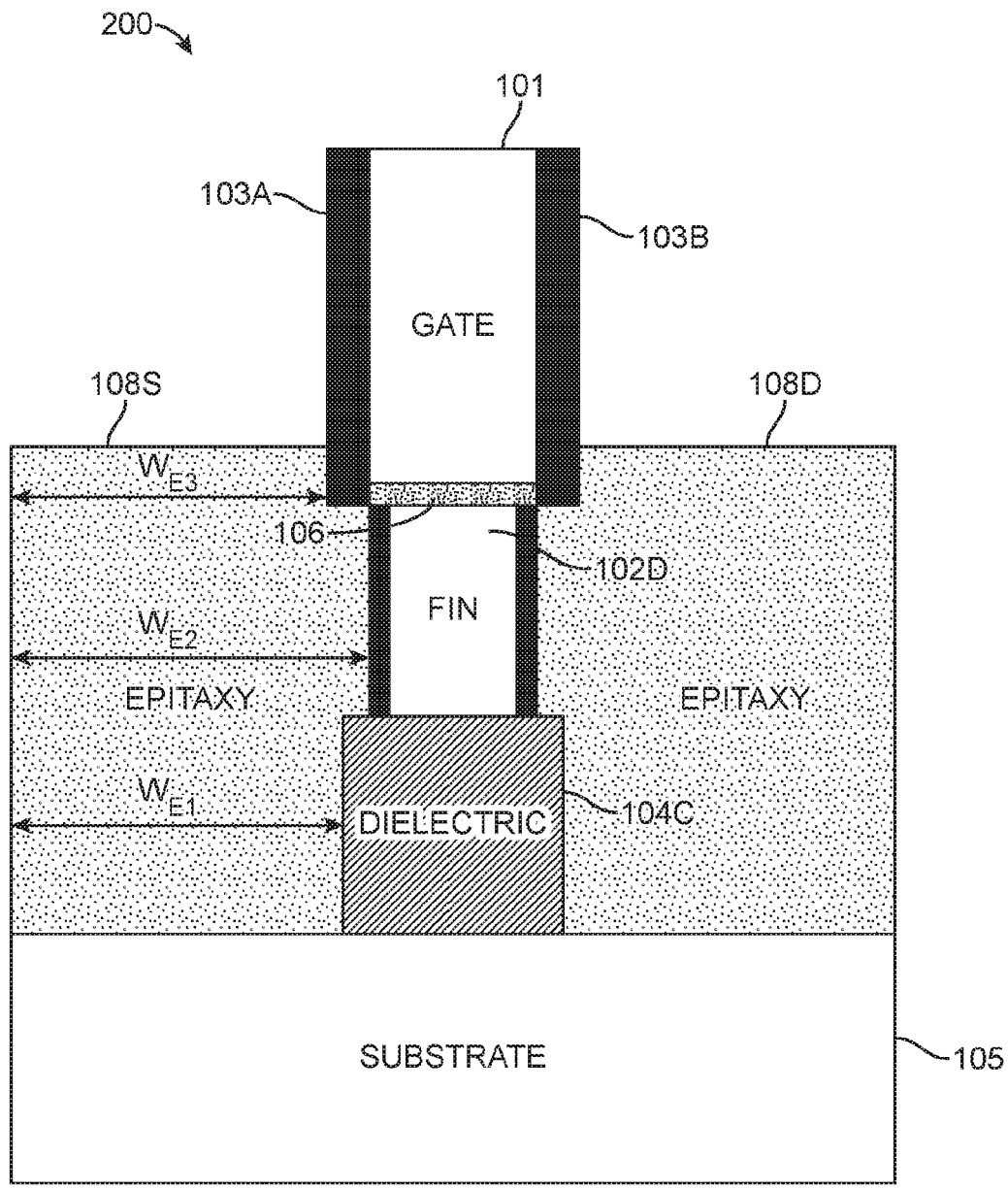
FIG. 7 illustrates the partial FOX FinFET structure after epitaxial deposition, in accordance with an embodiment.

FIG. 7 illustrates the partial FOX FinFET structure 200 after epitaxial deposition, in accordance with an embodiment. After epitaxial deposition, a source epitaxy 108S and a drain epitaxy 108D are formed via vertical epitaxial crystal growth on the exposed substrate surfaces 105A and 105B, respectively. In one example implementation, each epitaxy 108S, 108D comprises silicon germanium (eSiGe with in-situ boron doping). In another example implementation, each epitaxy 108S, 108D comprises silicon with in-situ phosphorus doping. In one embodiment, carbon may be added during the epitaxy crystal growth process.

As shown in FIG. 7, each epitaxy 108S, 108D has varying widths. For example, let $W_{E1}$, $W_{E2}$ and $W_{E3}$ denote varying widths of the source epitaxy 108S.

A portion of the source epitaxy 108S may overlap horizontally with the gate dielectric 106. A portion of the drain epitaxy 108D may overlap horizontally with the gate dielectric 106.

In other embodiments, the fin channel 102D, the source epitaxy 108S and the drain epitaxy 108D may comprise one or more other types of semiconductor materials.

Figure 8:
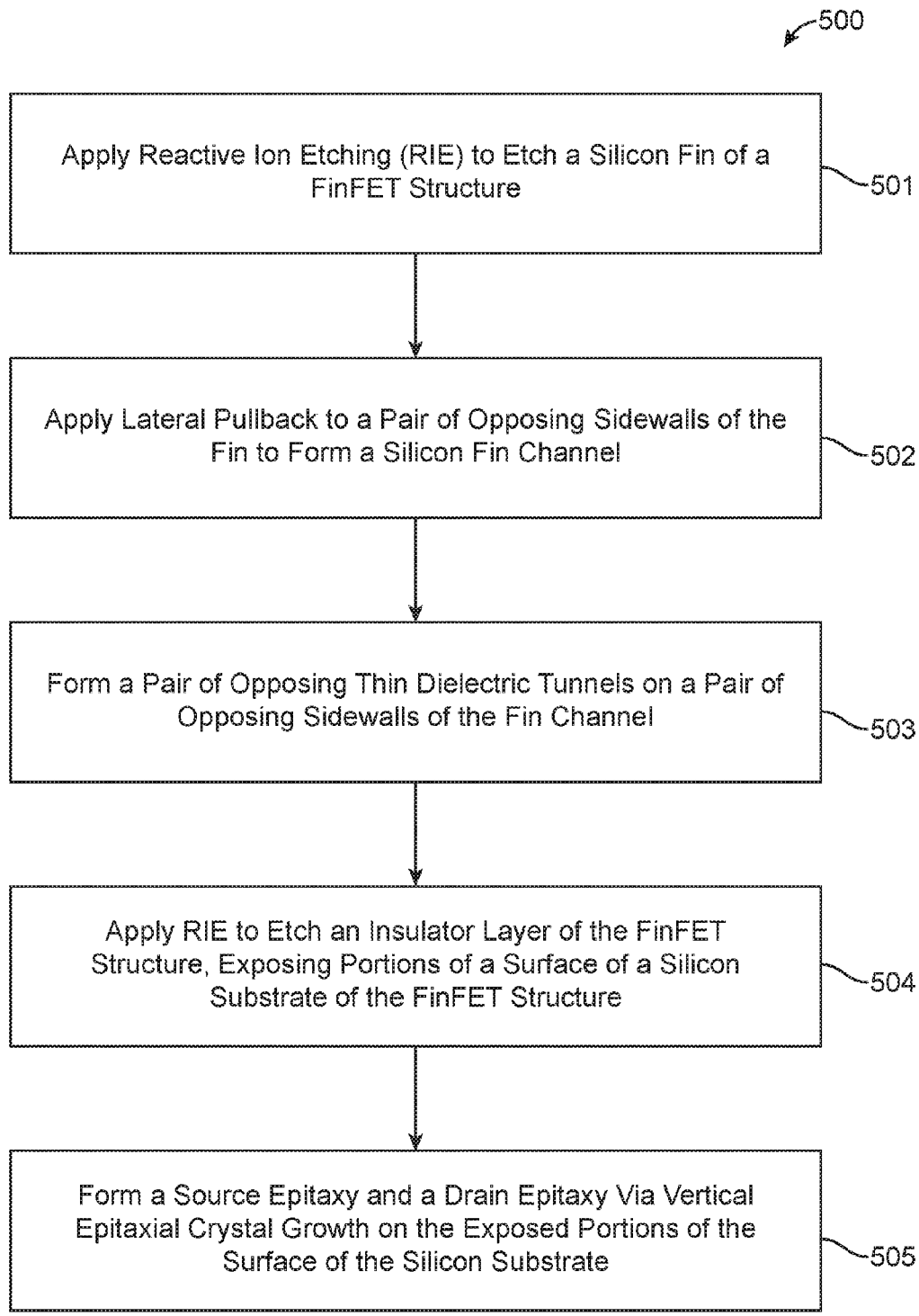
FIG. 8 illustrates an example flowchart for forming a partial FOX FinFET structure, in accordance with an embodiment The detailed description explains the preferred embodiments of the invention, together with advantages and features, by way of example with reference to the drawings.

FIG. 8 illustrates an example flowchart 500 for forming a partial FOX FinFET structure, in accordance with an embodiment. In process block 501, apply RIE to etch a silicon fin of a FinFET structure. In process block 502, apply lateral pullback to a pair of opposing sidewalls of the fin to form a silicon fin channel. In process block 503, form a pair of opposing thin dielectric tunnels on a pair of opposing sidewalls of the fin channel. In process block 504, apply RIE to etch an insulator layer of the FinFET structure, exposing portions of a surface of a silicon substrate of the FinFET structure. In process block 505, form a source epitaxy and a drain epitaxy via vertical epitaxial crystal growth on the exposed portions of the surface of the silicon substrate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    a substrate including a substrate surface;
    a fin channel including a first fin channel sidewall and a second fin channel sidewall opposing the first fin channel sidewall;
    a first thin dielectric tunnel and a second thin dielectric tunnel disposed on the first fin channel sidewall and the second fin channel sidewall, respectively, wherein each thin dielectric tunnel prevents lateral epitaxial crystal growth on the fin channel;
    an insulator layer including a first insulator layer sidewall and a second insulator layer sidewall opposing the first insulator layer sidewall, wherein the insulator layer is disposed between the substrate and the fin channel to insulate the substrate from the fin channel, and the insulator layer is narrower than the substrate, thereby exposing portions of the substrate surface for vertical epitaxial crystal growth;
    a gate perpendicular to the fin channel, wherein the fin channel is narrower than the gate;
    a spacer including a first spacer sidewall and a second spacer sidewall opposing the first spacer sidewall, wherein the first spacer sidewall and the second spacer sidewall are substantially aligned with the first insulator layer sidewall and the second insulator layer sidewall, respectively;
    a dielectric layer disposed between the fin channel and the gate to separate the fin channel from the gate;
    a source epitaxy resulting from vertical epitaxial crystal growth on at least one exposed portion of the substrate surface; and
    a drain epitaxy resulting from vertical epitaxial crystal growth on at least one other exposed portion of the substrate surface.

2. The semiconductor structure of claim 1, wherein the fin, the substrate, the source epitaxy and the drain epitaxy comprise at least one semiconductor material.

3. The semiconductor structure of claim 1, wherein the insulator layer and each thin dielectric tunnel comprise at least one dielectric material.

4. The semiconductor structure of claim 1, wherein each thin dielectric tunnel has a corresponding thickness that allows current to pass through it, thereby enabling the current to flow through the fin channel from the source epitaxy to the drain epitaxy.

5. The semiconductor structure of claim 4, wherein each thin dielectric tunnel has a corresponding thickness that is less than one nanometer.

6. The semiconductor structure of claim 1, wherein each thin dielectric tunnel is formed by one of thermal nitridation or plasma nitridation.

\* \* \* \* \*